(12) United States Patent
Lee et al.

(10) Patent No.: US 6,955,981 B2
(45) Date of Patent: Oct. 18, 2005

(54) PAD STRUCTURE TO PROMPT EXCELLENT BONDABILITY FOR LOW-K INTERMETAL DIELECTRIC LAYERS

(75) Inventors: Tze-Liang Lee, Hsinchu (TW); Yun-San Huan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/243,910

(22) Filed: Sep. 13, 2002

(65) Prior Publication Data

US 2004/0052990 A1 Mar. 18, 2004

(51) Int. Cl.[7] .............................................. H01L 21/44
(52) U.S. Cl. ...................................... 438/612; 438/614
(58) Field of Search ................................ 438/612, 613, 438/614, 617, 622; 257/784, 786, 758

(56) References Cited

U.S. PATENT DOCUMENTS

| | | | |
|---|---|---|---|
| 5,739,587 A | 4/1998 | Sato | 257/758 |
| 5,796,171 A * | 8/1998 | Koc et al. | 257/786 |
| 5,923,088 A | 7/1999 | Shiue et al. | 257/758 |
| 6,100,573 A * | 8/2000 | Lu et al. | 257/508 |
| 6,198,170 B1 * | 3/2001 | Zhao | 257/784 |
| 6,236,114 B1 | 5/2001 | Huang et al. | 257/758 |
| 6,258,715 B1 | 7/2001 | Yu et al. | 438/648 |
| 6,287,950 B1 | 9/2001 | Wu et al. | |
| 6,448,641 B2 * | 9/2002 | Ker et al. | 257/700 |
| 6,455,943 B1 * | 9/2002 | Sheu et al. | 257/786 |

FOREIGN PATENT DOCUMENTS

| | | |
|---|---|---|
| TW | 430935 | 4/2001 |
| TW | 439247 | 6/2001 |
| TW | 447103 | 7/2001 |

* cited by examiner

Primary Examiner—David Nelms
Assistant Examiner—Quoc Hoang
(74) Attorney, Agent, or Firm—Haynes and Boone, LLP

(57) ABSTRACT

A method of fabricating a bonding pad anchoring structure comprising the following steps. Providing a substrate. Forming a series of grated metal layers over the substrate separated by an interleaving series of via plug layers having via plugs electrically connecting respective at least a portion of adjacent grated metal layers. The series of grated metal layers having an uppermost grated metal layer. Forming an uppermost via plug layer over the uppermost grated metal layer. The uppermost via plug layer having via plugs. Forming a bonding pad layer over the uppermost via plug layer so that the uppermost via plugs within the uppermost via plug layer electrically connect the bonding pad layer to at least a portion of the uppermost grated metal layer whereby the bonding pad layer is securely bonded to the substrate.

30 Claims, 4 Drawing Sheets

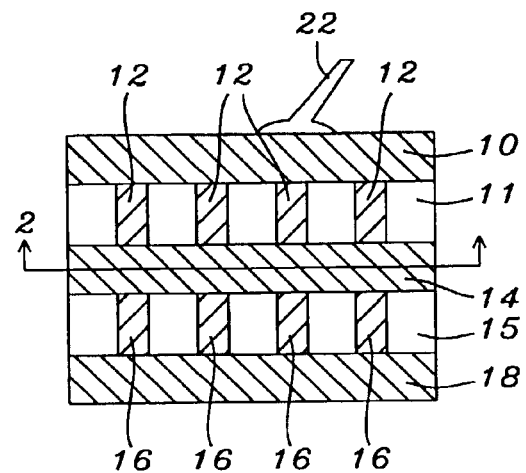
FIG. 1 - Prior Art
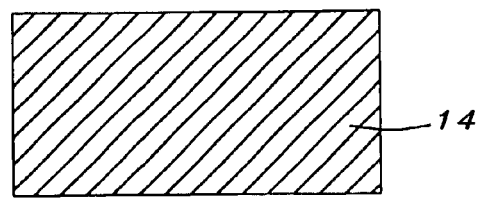
FIG. 2 - Prior Art
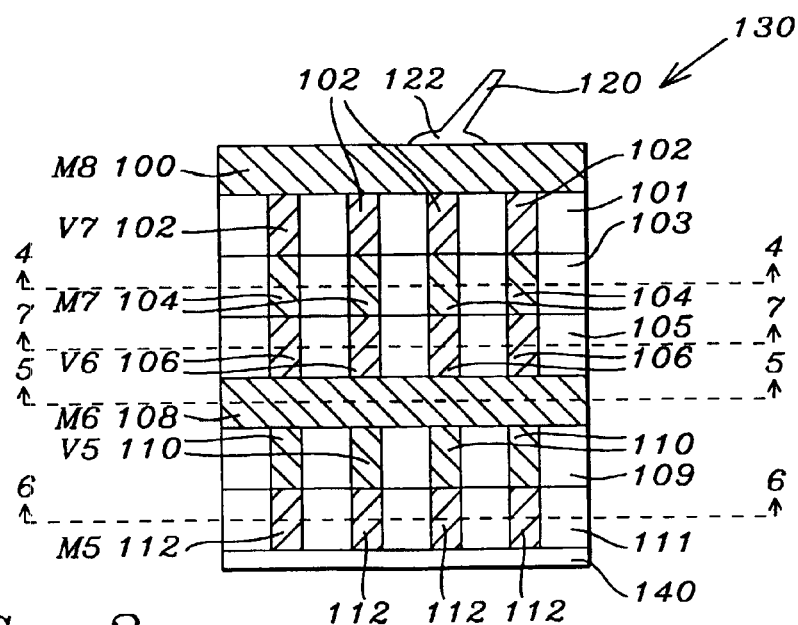
FIG. 3

PAD STRUCTURE TO PROMPT EXCELLENT BONDABILITY FOR LOW-K INTERMETAL DIELECTRIC LAYERS

FIELD OF THE INVENTION

The present invention relates generally to semiconductor fabrication and more specifically to processes of fabricating pad structures.

BACKGROUND OF THE INVENTION

Poor bondability of bonding pads is a continuing issue to low-k intermetal dielectric (IMD) layers. Pad peeling and craters have been found during wire bonding processes and post-testing. Mechanical stress also degrades performance.

For example, FIG. 1 illustrates a conventional N level bonding pad 10 with metal via anchors 12 (through IMD layer 11) anchoring and electrically connecting N level bonding pad 10 to N-1 level metal layer 14. Bonding wire 20 is electrically affixed to N level bonding pad 10 as at 22.

Metal via plugs 16 (through IMD layer 15) electrically connect N-1 level metal layer 14 to N-2 level metal layer 18. FIG. 2 is a cross-section of FIG. 1 taken along line 2—2 of FIG. 1, illustrating that the N-1 level, etc., metal layer 14 is a solid sheet layer. This structure suffers from the above described shortfalls.

U.S. Pat. No. 6,258,715 B1 to Yu et al. describes plugs under bonding pads to improve adhesion.

U.S. Pat. No. 6,236,114 B1 to Huang et al. describes a bonding pad with extra vias.

U.S. Pat. No. 5,923,088 to Shiue et al. describes a bonding pad structure with via plugs thereunder.

U.S. Pat. No. 5,739,587 to Sato describes another bonding pad structure with via plugs thereunder.

SUMMARY OF THE INVENTION

Accordingly, it is an object of one or more embodiments of the present invention to provide an improved method of anchoring a bonding pad.

Other objects will appear hereinafter.

It has now been discovered that the above and other objects of the present invention may be accomplished in the following manner. Specifically, a substrate is provided. Forming a series of grated metal layers over the substrate separated by an interleaving series of via plug layers having via plugs electrically connecting respective at least a portion of adjacent grated metal layers. The series of grated metal layers having an uppermost grated metal layer. Forming an uppermost via plug layer over the uppermost grated metal layer. The uppermost via plug layer having via plugs. Forming a bonding pad layer over the uppermost via plug layer so that the uppermost via plugs within the uppermost via plug layer electrically connect the bonding pad layer to at least a portion of the uppermost grated metal layer whereby the bonding pad layer is securely bonded to the substrate.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1 and 2 schematically illustrate a prior art bonding pad anchoring structure with FIG. 2 being a cross-section of FIG. 1 along line 2—2.

FIGS. 3 to 7 schematically illustrate a preferred embodiment of the present invention with FIG. 4 being a cross-section of FIG. 3 along line 4—4; FIG. 5 being a cross-section of FIG. 3 along line 5—5; FIG. 6 being a cross-section of FIG. 3 along line 6—6; and FIG. 7 being a cross-section of FIG. 3 along line 7—7.

DETAILED DESCRIPTION OF THE PREFERRED EMBODIMENT

Unless otherwise specified, all structures, layers, steps, methods, etc. may be formed or accomplished by conventional steps or methods known in the prior art.

As shown in FIG. 3, bonding pad anchoring structure 130 includes an uppermost metal layer M8, i.e. bonding pad 100 with a bonding wire 120 affixed to bonding pad 100 as at 122. Uppermost metal layer M8 need not be grated.

Figure 4:
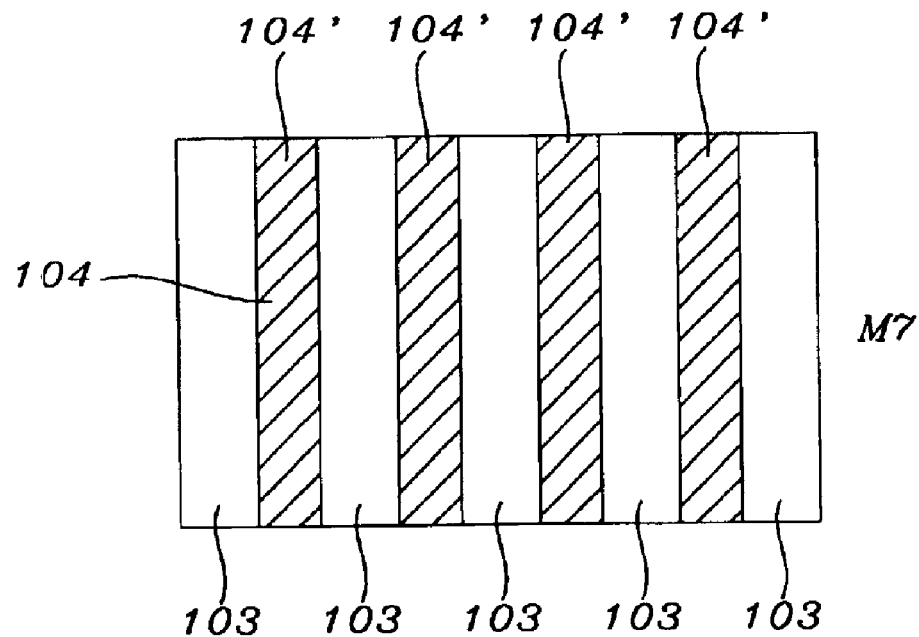

Metal V7 via plugs 102 formed through intermetal dielectric (IMD) layer 101 electrically connect M8 bonding pad 100 to M7 metal layer 104 formed through dielectric layer 103. Bonding pad 100 may be a solid sheet of metal or may be grated as are the underlying metal layers 104, 108, 112. As shown in FIG. 4, M7 metal layer 104 is grated and comprises spaced apart metal lines 104'.

Figure 5:
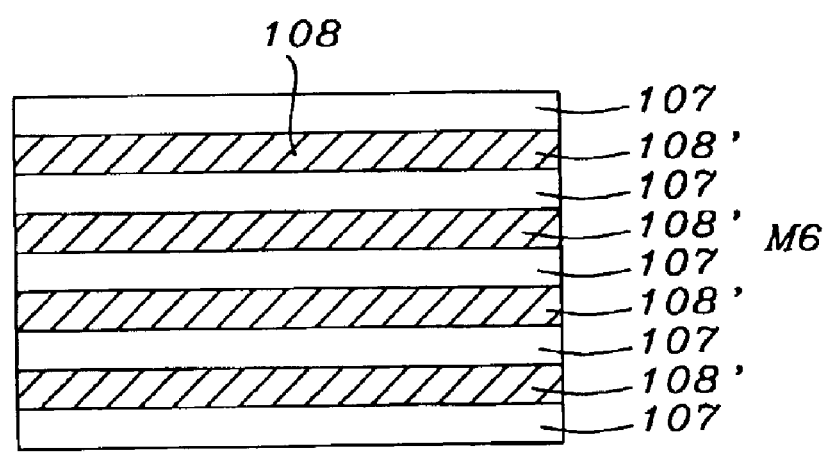
Figure 7:
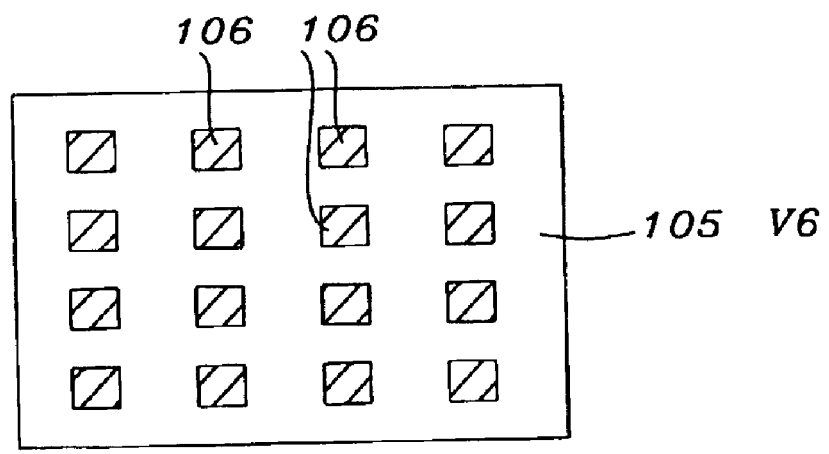

Metal V6 via plugs 106 formed through IMD layer 105 electrically connect M7 metal layer 104 to M6 metal layer 108 formed through low-k dielectric layer 107. As shown in FIG. 5, M6 metal layer 108 is also grated and comprises spaced apart metal lines 108'. As shown in FIG. 7, metal V6 via plugs 106 (as are metal V7 via plugs 102, metal V5 via plugs 110 and all underlying metal via plugs) are located at the intersection of the adjacent V7 metal layer 102 metal lines 102' and V6 metal layer 108 metal lines 108'.

As shown in FIGS. 3 and 5, M6 metal layer 108 metal lines 108' may be rotated at a ninety degree (90°) relative to M7 metal layer 104 metal lines 104'. This 90° rotation creates more interface between the metal and the low-k material in the lattice.

If current degradation is a problem due to the 90° rotation, M6 metal layer 105 metal lines 105' may be substantially parallel relative to M7 metal layer 104 metal lines 104'.

Figure 6:
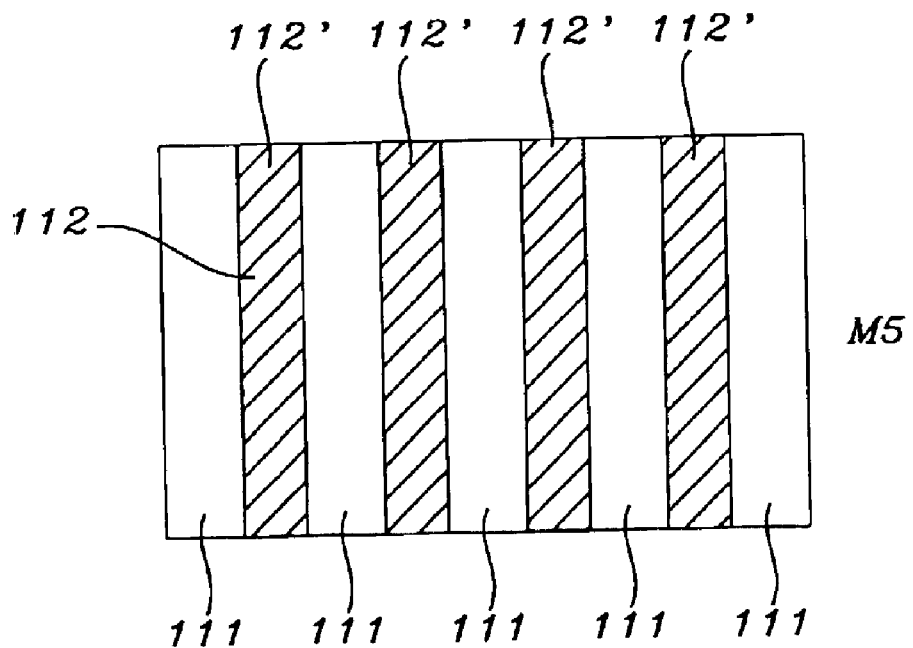

Metal V5 via plugs 110 formed through IMD layer 109 electrically connect M6 metal layer 108 to M5 metal layer 112 formed through low-k dielectric layer 109. As shown in FIG. 6, M5 metal layer 112 is also grated and comprises spaced apart metal lines 112'. As shown in FIGS. 3 and 6, M5 metal layer 112 metal lines 112' may be rotated at a ninety degree (90°) relative to M6 metal layer 108 metal lines 108'. This 90° rotation again creates more interface between the metal and the low-k material in the lattice.

Again, if current degradation is a problem due to the 90° rotation, M5 metal layer 112 metal lines 112' may be substantially parallel relative to M6 metal layer 108 metal lines 108'.

Additional metal via plugs/metal layers may be formed down to V1 and M1 layers (not shown) within structure 140. Structure 40 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Each such additional lower metal layers are each comprised of spaced metal lines that may be either rotated substantially 90° relative to the immediately overlying metal layer or may be substantially parallel relative to the immediately overlying metal layer as shown and described herein.

The metal layers 100, 104, 108, 112, etc. the metal via plugs 102, 106, 110, etc. are preferably comprised of copper, aluminum, gold, tungsten (W) or titanium (Ti) and are more preferably copper. IMD layers 101, 105, 109 are preferably comprised of low-k material such as FSG, SiLK, nanoglass, Black Diamond™ or a porous dielectric material. IMD layers 101, 105, 109 preferably have a dielectric constant (k) of less than about 3.2. IMD layers 101, 105, 109 each have a thickness of preferably from about 2000 to 10,000 Å and more preferably from about 4000 to 8000 Å.

Dielectric layers 103, 107, 111 are preferably comprised of low-k material such as FSG, SiLK, nanoglass, Black Diamond™ or a porous dielectric material. Dielectric layers 103, 107, 111 preferably have a dielectric constant (k) of less than about 3.0. Dielectric layers 103, 107, 111 each have a thickness of preferably from about 2000 to 30,000 Å and more preferably from about 2500 to 10,000 Å.

Metal lines 104', 108', 112' (and any underlying metal lines) have a width of preferably from about 10,000 to 50,000 Å and more preferably from about 20,000 to 30,000 Å and are spaced apart preferably from about 10,000 to 50,000 Å and more preferably from about 10,000 to 30,000 Å. The widths and spacing of the metal lines 104', 108', 112' (and any underlying metal lines) are adjustable to accommodate the differing low-k materials comprising IMD layers 101, 105, 109 (and any underlying IMD layers).

The grating of metal lines 104', 108', 112' (and any underlying metal lines) achieves good bondability and eliminates any mechanical stress issue. Since the metal lines 104', 108', 112' (and any underlying metal lines) are adjacent to IMD, the main energy of the bonding wire 120 is absorbed upon the periphery of the metal lines 104, 108, 112 just as if the metal layers 104, 108, 112 (and any underlying metal lines) were solid sheets and can be absorbed by the multiple peripheries. Further, chemical mechanical polishing (CMP) dishing effects are reduced using the grating structure of the metal lines 104', 108', 112' (and any underlying metal lines). The lattice structure of the bonding pad anchoring structure 130 of the present invention improves the mechanical properties of the overall structure 130 akin to reinforced concrete.

In tests, the novel bonding pad anchoring structure 130 of the present invention produced about a 96% bonding yield and is admirable suited for 0.13 μm rule and beyond.

Figures 8A, 8B, 8C:
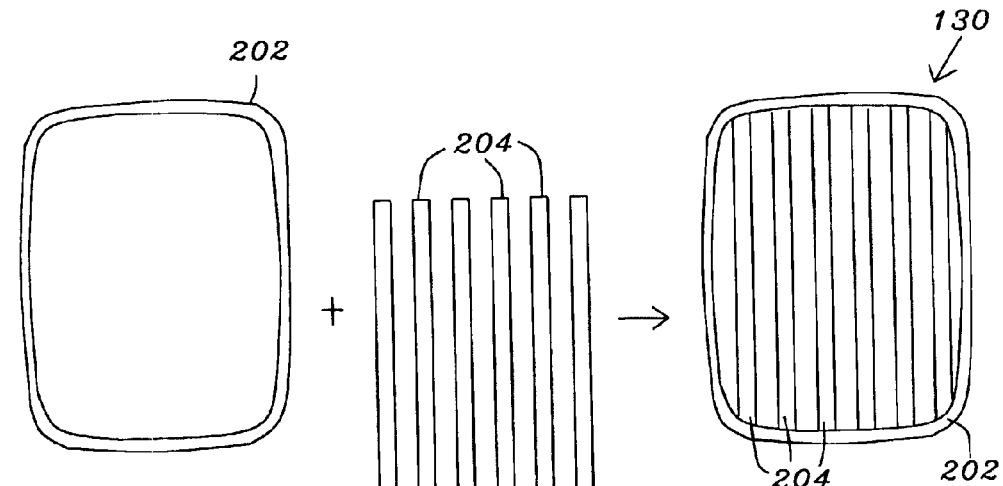
FIGS. 8A, 8B and 8C schematically illustrate a plan view of a bonding pad structure anchored by the method of the present invention.

A First Bonding Pad 130 Structure—FIGS. 8A, 8B and 8C

FIGS. 8A, 8B and 8C illustrate a plan view, i.e. a top down view, of one preferred structure of the bonding pad 130 having an outer metal ring 202 and a non-continuous series of spaced-apart, equal length grated metal lines 204.

The bonding pad structure illustrated in FIG. 8C may be used in other IMD layers 101, 105, 109.

Figures 9A, 9B, 9C:
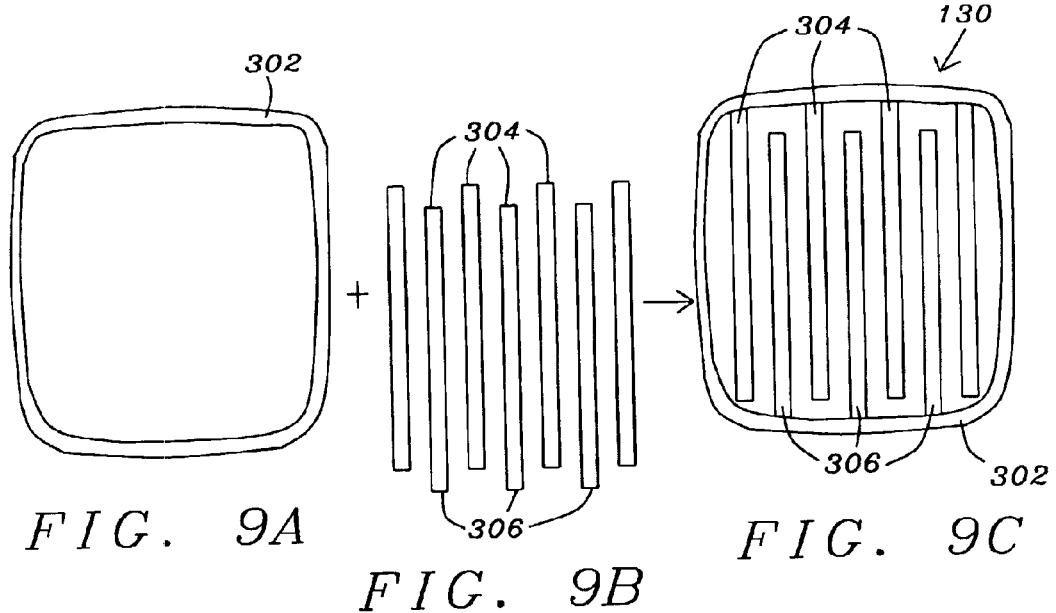
FIGS. 9A, 9B and 9C schematically illustrate a plan view of an alternate bonding pad structure anchored by the method of the present invention.

A Second Bonding Pad 130 Structure—FIGS. 9A, 9B and 9C

FIGS. 9A, 9B and 9C illustrate a plan view, i.e. a top down view, of another preferred structure of the bonding pad 130 having an outer metal ring 302 and a non-continuous series of spaced-apart, equal length, staggered grated metal lines 304, 306.

The bonding pad structure illustrated in FIG. 9C may be used in other IMD layers 101, 105, 109.

According to a variation, one or more of the series of grated metal layers 104, 108 and 112 could have an outer metal ring and a series of non-continuous, spaced-apart grated metal lines.

Advantages of the Present Invention

The advantages of one or more embodiments of the present invention include:
1. bonding pad bondability is improved;
2. mechanical stress due to the bonding wire is greatly reduced;
3. any metal cup dishing effect is automatically attenuated;
4. the package (pkg) level thermal property is improved; and
5. the peeling process issue is automatically resolved.

While particular embodiments of the present invention have been illustrated and described, it is not intended to limit the invention, except as defined by the following claims.

We claim:

1. A method of fabricating a bonding pad anchoring structure, comprising the steps of:
   providing a substrate;
   forming a series of grated metal layers over the substrate separated by a interleaving series of via plug layers having via plugs electrically connecting respective at least a portion of adjacent grated metal layer; the series of grated metal layers having an uppermost grated metal layer;
   forming an uppermost via plug layer over the uppermost grated metal layer; the uppermost via plug layer having via plugs; and
   forming a bonding pad layer over the uppermost via plug layer so that the uppermost via plugs within the uppermost via plug layer electrically connect the bonding pad layer to at least a portion of the uppermost grated metal layer; wherby the bonding pad layer is securely bonded to the substrate;
   wherein the bonding pad layer comprises a bonding pad; the bonding pad comprising an outer metal ring a series of non-continuous, spaced-apart grated metal lines.

2. The method of claim 1, wherein the grated metal layers include metal lines comprised of a material selected from the group consisting of: copper, aluminum, gold, tungsten and titanium; and the via plugs are comprised of a material selected from the group consisting of: copper, aluminum, gold, tungsten and titanium.

3. The method of claim 1, wherein the grated metal layers include metal lines comprised of copper; and the via plugs are comprised of copper.

4. The method of claim 1, wherein the via plug layers comprise via plugs formed through IMD layers.

5. The method of claim 1, wherein the via plug layers comprise via plug formed through respective IMD layers, the IMD layers being comprised of a material selected from the group consisting of FSG, SiLK, nanoglass, Black Diamond™ and a porous dielectric material; and the grated metal layers comprise grated metal lines formed through respective dielectric layers, the dielectric layer being comprised of a material selected from the group consisting of FSG, SiLK, nanoglass, Black Diamond™ and a porous dielectric material.

6. The method of claim 1, wherein the grated metal layers comprise grated metal lines formed through respective dielectric layer; the grated metal lines being substantially parallel to one another.

7. The method of claim 1, wherein the grated metal layers comprise grated metal lines formed through respective dielectric layers; at least some of the grated metal lines being substantially perpendicular to one another.

8. The method of claim 1, including the step of affixing a bonding pad wire to the bonding pad layer.

9. A method of fabricating a bonding pad anchoring structure, comprising the steps of:
providing a substrate;
forming a series of grated metal layers over the substrate separated by an interleaving series of via plugs layers having via plugs electrically connecting reapective at least a portion of adjacent grated metal layers; the series of grated metal layers having an uppermost grated metal layer;
forming an uppermost via plug layer over the uppermost grated metal layer; the uppermost via plug layer having via plugs; and
forming a bonding pad layer over the uppermost via plug layer so that the uppermost via plugs within the uppermost via plug layer electrically connect the bonding pad layer to at least a portion of the uppermost grated metal layer; whereby the bonding pad layer is securely bonded to the substrate;
wherein one or more of the series of grated metal layers comprise an outer metal ring and a series of non-continuous, spaced-apart grated metal lines.

10. A method of fabricating a bonding pad anchoring structure, comprising the steps of:
providing a substrate;
forming a series of grated metal layer over the substrate seperated by an interleaving series of via plug layers having via plugs electrically connecting respective at least a portion of adjacent grated metal layers; the series of grated metal layers having an uppermost grated metal layer; the grated metal layers include metal lines comprised of a material selected from the group consisting of: copper, aluminum, gold, tungsten and titanium;
forming an uppermost via plug layer over the uppermost grated metal layer; the uppermost via plug having via plugs; the via plugs are comprised of a material selected from the group consisting of: copper, aluminum, gold, tungsten and titanium; and
forming a bonding pad layer over the uppermost via plug layer so that the uppermost via plugs within the uppermost via plug layer electrically connect the bonding pad layer to at least a portion of the uppermost grated metal layer; whereby the bonding pad layer is securely bonded to the substrate;
wherein the bonding pad layer comprises a bonding pad; the bonding pad comprising an outer metal ring and a series of non-continuous, spaced-apart grated metal lines.

11. The method of claim 10, wherein the metal lines are comprised of copper; and the via plugs are comprised of copper.

12. The method of claim 10, wherein the via plug layers comprise via plugs formed through IMD layers.

13. The method of claim 10, wherein the via plug layers comprise via plugs formed through respective IMD layers, the IMD layers being comprised of a material selected from the group consisting of FSG, SiLK, nanoglass, Black Diamoad™ and a porous dielectric material; and the grated metal layers comprise grated metal lines formed through respective dielectric layer, the dielectric layer being comprised of a material selected from the group consisting of FSG, SiLK, nanoglass, Black Dimoud™ and a porous dielectric material.

14. The method of claim 10, wherein the grated metal layers comprise grated metal lines formed through respective dielectric layers; the grated metal lines being substantially parallel to one another.

15. The method of claim 10, wherein the grated metal layers comprise grated metal lines formed through respective dielectric layers; at least some of the grated metal lines being substantially perpendicular to one another.

16. The method of claim 10, including the step of affixing a bonding pad wire to the bonding pad layer.

17. The method of claim 10, wherein one or more of the series of grated metal layers comprise an outer metal ring and a series of non-continuous, spaced-apart grated metal lines.

18. A method of fabricating a bonding pad anchoring structure, comprising the steps of:
providing a substrate;
forming a series of grated metal layers over the substrate separated by an interleaving series of via plug layers having via plugs electrically connecting respective at least a portion of adjacent grated metal layers; the series of grated metal layers having an uppermost grated metal layer; the grated metal layers include copper metal lines;
forming an uppermost via plug layer over the uppermost grated metal layer; the uppermost via plug layer having via plugs; the via plugs are comprised of copper; and
forming a bonding pad layer over the uppermost via plug layer so that the uppermost via plugs within the uppermost via plug layer electrically connect the bonding pad layer to at least a portion of the uppermost grated metal layer; whereby the bonding pad layer is securely bonded to the substrate;
wherein the bonding pad layer comprises a bonding pad; the bonding pad comprising an outer metal ring and a series of non-continuous spaced-apart grated metal lines.

19. The method of claim 18, wherein the via plug layers comprise via plugs formed through IMB layers.

20. The method of claim 18, wherein the via plug layers comprise via plugs formed through respective IMD layers, the IMD layers being comprised of a material selected from the group consisting of FSG, SiLK, nanoglass, Black Diamond™ and a porous dielectric material; and the grated metal layers comprise grated metal lines formed through respective dielectric layers, the dielectric layer being comprised of a material selected from the group consisting of FSG, SilK, nanoglass, Black Diamond™ and a porous dielectric material.

21. The method of claim 18, wherein the grated metal layers comprise grated metal lines formed through respective dielectric layers; the grated metal lines being substantially parallel to one another.

22. The method of claim 18, wherein the grated metal layers comprise grated metal lines formed through respective dielectric layers; at least some of the grated metal lines being substantially perpendicular to one another.

23. The method of claim 18, including the step of affixing a bonding pad wire to the bonding pad layer.

24. The method of claim 18, wherein one or more of the series of grated metal layers comprise an outer metal ring and a series of non-continuous, spaced-apart grated metal lines.

25. A method of fabricating a bonding pad anchoring structure, comprising the steps of:

providing a substrate;

forming a series of grated metal layer over the substrate separated by an interleaving series of via plug layers having via plugs electrically connecting respective at least a portion of adjacent grated metal layers; the series of metal layers having an uppermost grated metal layer; the grated metal layers include copper metal lines;

forming an uppermost via plug layer over the uppermost grated metal layer; the uppermost via plug layer having via plugs; the via plugs are comprised of copper;

forming a bonding pad layer over the uppermost via plug layer so that the uppermost via plugs within the uppermost via plug layer electrically connect the bonding pad layer to at least a portion of the uppermost grated metal layer; whereby the bonding pad layer is securely bonded to the substrate; and affixing a bonding pad wire to the bonding pad layer;

wherein the bonding pad layer comprises a bonding pad; the bonding pad comprising an outer metal ring and a series of non-continuous, spaced-apart grated metal lines.

26. The method of claim 25, wherein the via plug layers comprise via plugs formed through IMD layers.

27. The method of claim 25, wherein the via plug layers comprise via plugs formed through respective IMD layers, the IMD layers being comprised of a material selected from the group consisting of FSG, SiLK, nanoglass, Black Diamond™ and a porous dielectric material; and the grated metal layers comprise grated metal lines formed through respective dielectric layers, the dielectric layer being comprised of a material selected from the group consisting of FSG, SiLK, nanoglass, Black Dismond™ and a porous dielectric material.

28. The method of claim 25, wherein the grated metal layers comprise grated metal lines formed through respective dielectric layers; the grated metal lines being substantially parallel to one another.

29. The method of claim 25, wherein the grated metal layers comprise grated metal lines formed through respective dielectric layers; at least some of the grated metal lines being substantially perpendicular to one another.

30. The method of claim 25, wherein one or more of the series of grated metal layers comprise an outer metal ring and a series of non-continuous, spaced-apart grated metal lines.

\* \* \* \* \*